United States Patent
Kohl et al.

(10) Patent No.: US 7,504,699 B1
(45) Date of Patent: Mar. 17, 2009

(54) FABRICATION OF A SEMICONDUCTOR DEVICE WITH AIR GAPS FOR ULTRA-LOW CAPACITANCE INTERCONNECTIONS

(75) Inventors: Paul A. Kohl, Atlanta, GA (US); Qiang Zhao, San Jose, CA (US); Sue Ann Bidstrup Allen, Atlanta, GA (US)

(73) Assignee: George Tech Research Corporation, Atlanta, GA (US)

( * ) Notice: Subject to any disclaimer, the term of this patent is extended or adjusted under 35 U.S.C. 154(b) by 0 days.

(21) Appl. No.: 09/717,567

(22) Filed: Nov. 21, 2000

Related U.S. Application Data

(62) Division of application No. 09/009,952, filed on Jan. 21, 1998, now Pat. No. 6,165,890.

(60) Provisional application No. 60/035,848, filed on Jan. 21, 1997.

(51) Int. Cl.
*H01L 21/331* (2006.01)
*H01L 21/76* (2006.01)
*H01L 21/4763* (2006.01)
*H01L 21/44* (2006.01)
*H01L 21/469* (2006.01)
*H01L 21/461* (2006.01)

(52) U.S. Cl. .................. 257/410; 257/508; 257/522; 257/758; 257/759; 257/760; 438/319; 438/411; 438/421; 438/422; 438/618; 438/619; 438/622; 438/623; 438/624; 438/625; 438/626; 438/687; 438/692; 438/693

(58) Field of Classification Search ................ 257/773, 257/522, 758–760, 508, 410; 438/421–22, 438/624, 214, 280, 319, 411, 461, 611, 619, 438/522, 508, E21.564, E21.573, E21.583, 438/E21.013, 622, 623, 629
See application file for complete search history.

(56) References Cited

U.S. PATENT DOCUMENTS 3,787,710 A * 1/1974 Cunningham ............... 257/506

(Continued)

FOREIGN PATENT DOCUMENTS

| EP | 445755 | 9/1991 |
| EP | 936230 | 8/1999 |
| JP | 360021540 | * 2/1985 |
| JP | 62-005643 | * 12/1987 |
| JP | 63-099206 | 4/1988 |
| JP | 363098134 | * 4/1988 |
| WO | WO 97/20871 | 6/1997 |

OTHER PUBLICATIONS

IBM Technical Disclosure Bulletin, "Reduced Capacitance Interconnect System Using Decomposition of Air Gap Filler Material", vol. 38, No. 9, Sep. 1, 1995, pp. 137-140.

*Primary Examiner*—Matthew S. Smith
*Assistant Examiner*—James M Mitchell
(74) *Attorney, Agent, or Firm*—Renner, Otto, Boisselle & Sklar, LLP.

(57) ABSTRACT

A method of forming an air gap or gaps within solid structures and specifically semiconductor structures to reduce capacitive coupling between electrical elements such as metal lines, wherein a norbornene-type polymer is used as a sacrificial material to occupy a closed interior volume in a semiconductor structure. The sacrificial material is caused to decompose into one or more gaseous decomposition products which are removed, preferably by diffusion, through an overcoat layer. The decomposition of the sacrificial material leaves an air gap or gaps at the closed interior volume previously occupied by the norbornene-type polymer. The air gaps may be disposed between electrical leads to minimize capacitive coupling therebetween.

16 Claims, 10 Drawing Sheets

U.S. PATENT DOCUMENTS

| | | | | |
|---|---|---|---|---|
| 4,987,101 A | | 1/1991 | Kaanta et al. | 437/228 |
| 5,103,288 A | | 4/1992 | Sakamoto et al. | 357/71 |
| 5,266,126 A | | 11/1993 | Deguchi | 136/256 |
| 5,310,700 A | * | 5/1994 | Lien et al. | 438/618 |
| 5,324,683 A | * | 6/1994 | Fitch et al. | 437/65 |
| 5,416,355 A | * | 5/1995 | Kudoh | 257/529 |
| 5,461,003 A | | 10/1995 | Havemenn | 437/187 |
| 5,512,775 A | * | 4/1996 | Cho | 257/522 |
| 5,534,901 A | * | 7/1996 | Drake | 347/63 |
| 5,641,712 A | * | 6/1997 | Grivna et al. | 438/624 |
| 5,665,249 A | * | 9/1997 | Burke et al. | 216/2 |
| 5,668,398 A | * | 9/1997 | Havemann et al. | 257/508 |
| 5,693,566 A | * | 12/1997 | Cheung | 438/624 |
| 5,698,467 A | * | 12/1997 | Sakao et al. | 438/692 |
| 5,759,913 A | * | 6/1998 | Fulford et al. | 438/624 |
| 5,776,834 A | * | 7/1998 | Avanzino et al. | 438/692 |
| 5,783,481 A | * | 7/1998 | Brennan et al. | 438/623 |
| 5,783,639 A | * | 7/1998 | Kataoka et al. | 522/149 |
| 5,783,864 A | * | 7/1998 | Dawson et al. | 257/758 |
| 5,814,888 A | * | 9/1998 | Nishioka et al. | 257/758 |
| 5,835,987 A | * | 11/1998 | Givens | 257/522 |
| 5,847,439 A | * | 12/1998 | Reinberg | 257/522 |
| 5,869,880 A | * | 2/1999 | Grill et al. | 257/522 |
| 5,955,786 A | * | 9/1999 | Avanzino et al. | 257/758 |
| 5,990,557 A | * | 11/1999 | Avanzino et al. | 257/758 |
| 6,071,805 A | | 6/2000 | Liu | 438/619 |
| 6,130,151 A | * | 10/2000 | Lin et al. | 438/619 |
| 6,165,890 A | | 12/2000 | Kohl et al. | 438/619 |
| 6,211,057 B1 | * | 4/2001 | Lin et al. | 438/619 |
| 6,303,464 B1 | * | 10/2001 | Gaw et al. | 438/422 |
| 6,307,265 B1 | * | 10/2001 | Anand et al. | 257/522 |
| 6,376,330 B1 | * | 4/2002 | Fulford et al. | 438/421 |

* cited by examiner

FABRICATION OF A SEMICONDUCTOR DEVICE WITH AIR GAPS FOR ULTRA-LOW CAPACITANCE INTERCONNECTIONS

RELATED APPLICATION DATA

This application is a division of U.S. Ser. No. 09/009,952 filed Jan. 21, 1998, now U.S. Pat. No. 6,165,890, which claims the benefit of Provisional Application No. 60/035,848 filed on Jan. 21, 1997.

FIELD OF THE INVENTION

The invention herein described relates generally to the fabrication of semiconductor devices and more specifically to such devices that use air gaps to reduce capacitive coupling between conductors in such devices.

BACKGROUND OF THE INVENTION

As a consequence of the progress made in integrated circuit technology, the spacing between the metal lines on any given plane of an integrated circuit has become less and less, now extending into the submicrometer range. By reducing the spacing between conductive members in the integrated circuit, an increase in capacitive coupling occurs. This increase in capacitive coupling causes greater crosstalk, higher capacitive losses and increased RC time constant.

In order to reduce capacitive coupling, much effort has been directed toward developing low dielectric constant (low-K) materials to replace conventional dielectric materials that are interposed between the metal lines on a given layer and between layers. Many conventional electronic insulators have dielectric constants in the 3.5 to 4.2 range. For example, silicon dioxide has a dielectric constant of 4.2 and polyimides typically have dielectric constants from 2.9 to 3.5. Some advanced polymers have dielectric constants in the 2.5 to 3.0 range. Materials in the 1.8 to 2.5 range are also known, but such materials have had associated therewith severe processing, cost and materials problems.

The lowest possible, or ideal, dielectric constant is 1.0, which is the dielectric constant of a vacuum. Air is almost as good with a dielectric constant of 1.001. With this recognition of the low dielectric constant of air, attempts have been made to fabricate semiconductor devices with air gaps between metal leads to reduce the compacitive coupling between the electrically conducting members. The air gap forming techniques that have been developed have varying degrees of complexity.

U.S. Pat. No. 4,987,101 describes a method and structure for providing an insulating electrical space between two lines on a layer of material or between lines on adjacent superposed layers of material. A base member is formed having a plurality of support members extending upwardly from the base member. A removable material is deposited on the base member and around the support members. A cap member of insulating material is then disposed over said support members and the removable material. Access openings are formed in at least one of the base member or the cap member communicating with the removable material. The removable material is removed through the access openings to thereby define a space between the cap member and the base member and between the support members. During this step a partial vacuum (in which some inert gas may be dispersed) may be created in the space vacated by the removable material. The access openings are then filled in so as to provide a sealed space between the cap member and the base member which has a very low dielectric constant.

U.S. Pat. No. 5,324,683 describes several techniques for forming air gaps or regions in a semiconductor device. The air regions are formed by either selectively removing a sacrificial spacer or by selectively removing a sacrificial layer. The air regions are sealed, enclosed or isolated by either a selective growth process or by a non-conformal deposition technique. The air regions may be formed under any pressure, gas concentration or processing condition.

The techniques disclosed in the aforesaid patents rely on holes or other passageways for effecting removal of the sacrificial material. In U.S. Pat. No. 5,461,003, a sacrificial material is removed through a porous dielectric layer. According to this patent, metal leads are formed on a substrate, after which a disposable solid layer is deposited on the metal leads and substrate. The disposable solid layer is then etched back to expose the tops of the metal leads. Then a porous dielectric layer is deposited over the metal leads and disposable layer. This is followed by removal of the disposable layer which is said to be preferably accomplished by exposing the device to oxygen or oxygen-plasma at a high temperature (>100° C.) to vaporize, or burn off, the disposable layer. The oxygen moves through the porous dielectric layer to reach and react with the disposable layer and thereby convert it to a gas that moves back out of the porous dielectric layer. Upon removal of the disposable layer, air gaps are left to provide a low dielectric constant. Finally, a non-porous dielectric layer is deposited on top of the porous dielectric layer to seal the porous dielectric layer from moisture, provide improved structural support and thermal conductivity, and passivate the porous dielectric layer. This procedure results in an air gap that does not extend the full height of the adjacent metal leads or lines. The '003 patent discloses a modified method to remedy this and increase the process margin. This modified method involves a further process step wherein an oxide layer is formed on top of the metal leads so that the disposable dielectric layer can extend higher than the metal leads.

It is also noted that the exposure of the device to an oxygen plasma which must diffuse through a porous layer is not only inefficient, it also exposes other elements of the device to a potentially damaging oxygen plasma for an extended period of time. In particular, exposure of oxygen plasma to copper lines can prove deleterious. Copper is becoming an increasingly important metal in semiconductor manufacturing due to its lower resistivity when compared to aluminum.

SUMMARY OF THE INVENTION

The present invention provides a method of forming an air gap or gaps within solid structures and specifically semiconductor structures to reduce capacitive coupling between electrical elements such as metal lines. Such method overcomes one or more of the drawbacks associated with the aforesaid prior attempts to reduce capacitive coupling in semiconductor structures such as integrated circuits and packages.

According to one aspect of the invention, a method of forming an air gap in a semiconductor structure comprises the steps of (i) using a norbornene-type polymer as a sacrificial material to occupy a closed interior volume in a semiconductor structure; (ii) causing the sacrificial material to decompose (preferably self-decompose upon thermal treatment) into one or more gaseous decomposition products; and (iii) removing at least one of the one or more gaseous decomposition products by passage through at least one solid layer contiguous to the interior volume. The decomposition of the sacrificial material leaves an air gap at the closed interior volume previously occupied by the norbornene-type polymer.

In a preferred embodiment, the solid layer is a dielectric material through which at least one of the one or more gaseous decomposition products can pass by diffusion under conditions not detrimental to the semiconductor structure. Also, the norbornene-type polymer preferably is of the type herein described, which comprises repeat units of the general formula:

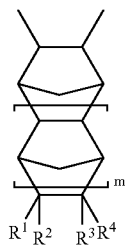

I wherein $R^1$ and $R^4$ independently represent hydrogen or linear or branched ($C_1$ to $C_{20}$) alkyl; $R^2$ and $R^3$ independently represent hydrogen, linear or branched ($C_1$ to $C_{20}$) alkyl or the groups:

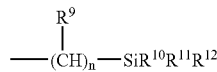

Ia $R^9$ independently is hydrogen, methyl, or ethyl; $R^{10}$, $R^{11}$, and $R^{12}$ independently represent linear or branched ($C_1$ to $C_{20}$) alkyl, linear or branched ($C_1$ to $C_{20}$) alkoxy, linear or branched ($C_1$ to $C_{20}$) alkyl carbonyloxy, and substituted or unsubstituted ($C_6$ to $C_{20}$) aryloxy; m is a number from 0 to 4; and n is a number from 0 to 5; and at least one of substituents $R^2$ and $R^3$ is selected from the silyl group represented by the formula set forth under Ia.

More generally, the sacrificial polymers useful in practicing the present invention preferably encompass homopolymers and copolymers containing random repeating units derived from a monomer unit or monomer units represented by Formula I, or homopolymers or copolymers containing random repeating units derived from monomer unit or units represented by the below set forth Formula II, homopolymers or copolymers containing repeating units derived from a monomer unit(s) represented by below set forth Formula III and copolymers comprising a combination of repeating units represented by Formulae I and II, Formulae I and III, Formulae II and III or Formulae I, II and III.

According to another aspect of the invention, a method of forming one or more air gaps in a semiconductor structure comprising the steps of (i) forming a patterned layer of sacrificial material on a substrate corresponding to a pattern of one or more gaps to be formed in the semiconductor structure; (ii) depositing a second material on the substrate within regions bordered by the sacrificial material; (iii) forming an overcoat layer of material overlying the patterned layer of sacrificial material and second material in the regions bordered by the sacrificial material; (iv) causing the sacrificial material to decompose into one or more gaseous decomposition products; and (v) removing at least one of the one or more gaseous decomposition products by passage through the overcoat layer so that one or more air gaps are formed within the semiconductor structure. It will be appreciated by the skilled artisan that the described process is particularly well suited to the copper-damascene process in that the dielectric material is patterned prior to metal deposition.

As is preferred, depositing of the second material includes using a conductive material to form conductive leads on opposite sides of portions of the sacrificial material. Prior to the forming of the overcoat layer, the conductive material may be formed with a height less than the height of the adjacent sacrificial material, such that the resultant air gaps extend beyond to the conductive leads, as may be desired to eliminate fringe effects.

According to a further aspect of the invention, a method of forming an air gap within a structure comprising the steps of (i) using a sacrificial material to occupy a closed interior volume in the structure; (ii) heating the sacrificial material to cause it to decompose into one or more gaseous decomposition products; and (ii) removing at least one of the one or more gaseous decomposition products by passage through at least one solid layer contiguous to the interior volume. As before, the decomposition of the sacrificial material leaves an air gap at the closed interior volume previously occupied by the sacrificial material.

The invention also provides structures, and particularly semiconductor structures, produced in accordance with the method of the invention.

The foregoing and other features of the invention are hereinafter fully described and particularly pointed out in the claims, the following description and the annexed drawings setting forth in detail one or more illustrative embodiments of the invention, such being indicative, however, of but one or a few of the various ways in which the principles of the invention may be employed.

BRIEF DESCRIPTION OF THE DRAWINGS

FIG. 2G is a diagrammatic cross-section similar to FIG. 2F, showing a variation of the semiconductor structure.

DETAILED DESCRIPTION OF PREFERRED EMBODIMENTS

Figure 1A:
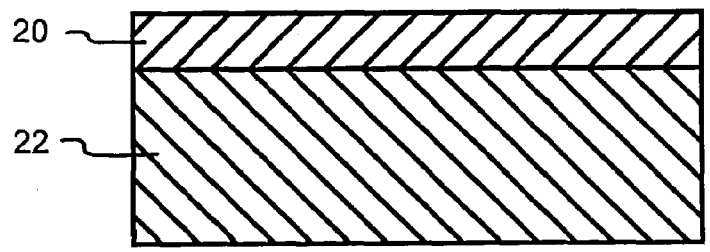
FIGS. 1A-1D are diagrammatic cross-sections of a portion of a semiconductor structure, illustrating several steps of a method according to one aspect of the invention.
Figure 1B:
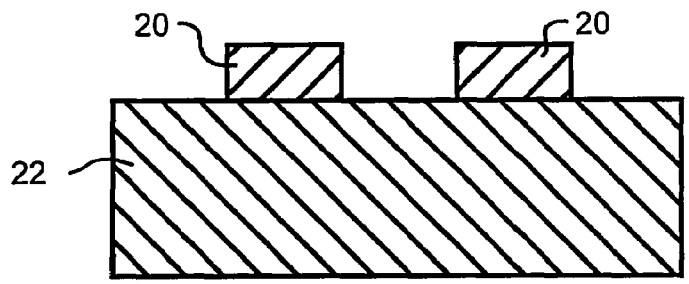
Figure 1C:
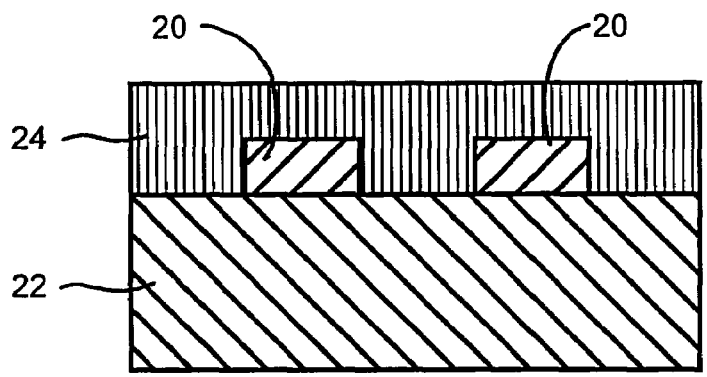
Figure 1D:
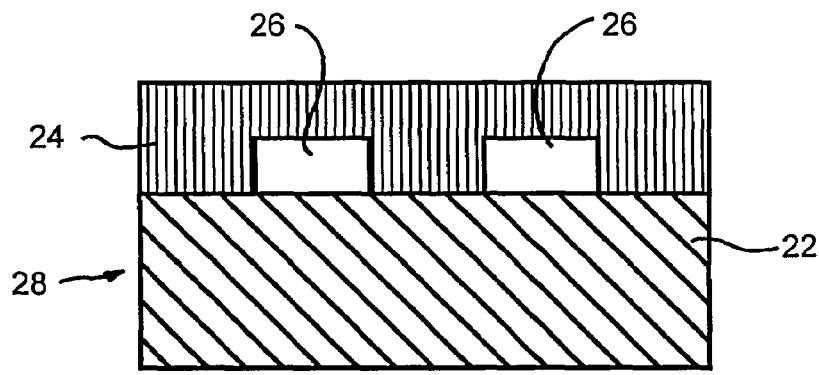

Referring now in detail to the drawings, the various steps of a method of producing a structure according to one aspect of the invention are diagrammatically illustrated in FIGS. 1A-1D. In FIGS. 1A and 1B, a patterned layer of sacrificial material 20 is formed on a substrate 22 by any suitable technique. This may be accomplished, for example, by first forming a layer of the sacrificial material on the substrate 22 as depicted in FIG. 1A and then patterning the layer, for example by etching or any other suitable technique, to form the patterned layer of sacrificial material 20 having one or more "hills" formed by the sacrificial material on the substrate with "valleys" formed between any two relatively adjacent hills. A second solid layer of a non-sacrificial material 24 is then formed on the patterned layer in overlying relation to the patterned layer 20 as depicted in FIG. 1C. Then, heat is applied to the decompose the sacrificial material into one or more gaseous decomposition products, and one or more of these decomposition products are removed by passing through the second layer 24. This provides an air-gap structure 28 having one or more air gaps 26 in the closed interior space or spaces previously occupied by the sacrificial material 20.

Generally, an air-gap structure is formed by using two dielectric materials, a sacrificial material which decomposes to gaseous products and a permanent material (at least permanent for purposes of forming the interior air gap or gaps) which forms a cover or overcoat through which one or more of the gaseous products can pass. Preferably such passage is by diffusion of one or more of the decomposition products through the overcoat material. More preferably, the decomposition reaction of the sacrificial material is induced solely by high temperature although other means may be used. The decomposition temperature should be compatible with the various components of the structure so as not to destroy the integrity thereof aside from the removal of the sacrificial material to form the air gap or gaps. Typically, such temperature should be less than about 500° C. for electrical interconnect devices and more preferably less than 450° C. It is contemplated that the decomposition temperature will fall in the range of about 380° C. to about 450° C., although materials having decomposition temperatures as low as about 150° C. may be beneficial. The sacrificial material, however, should be sufficiently thermally stable so that the permanent material can be processed to a condition where it is electrically and/or mechanically stable.

It should be further noted that any one or more of the herein described layers may be composed of multiple sub-layers, as may desired for different fabricating techniques. For example, the layer 24 in FIG. 1C may be composed of a first sub-layer at the same level as the sacrificial layer and a second sub-layer overlying the first sub-layer and the sacrificial material. Also, the indication that a layer is applied to an underlying layer does is not intended to preclude the presence of an intermediate layer that might be employed, for example, to enable bonding of one layer to another.

The preferred sacrificial material for carrying out the above-described method preferably is selected from the cycloolefin class of compounds and more preferably is a bicycloolefin with a norbornene-type polymer being most preferred. By norbornene-type polymer is meant polycyclic addition homopolymers and copolymers comprising repeating units set forth under Formulae I, II and III below. Copolymers useful in practicing the invention can include repeating units selected from the group comprising and/or consisting of Formulae I, II and III, or combinations thereof. The norbornene-type polymer that is particularly useful as the sacrificial material in the present invention is sold under the Avatrel® trademark by The BFGoodrich Company, Akron, Ohio. The polymer comprises silyl substituted repeating units represented by the structure set forth under Formula I below.

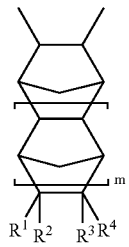

I wherein $R^1$ and $R^4$ independently represent hydrogen; linear or branched ($C_1$ to $C_{20}$) alkyl; $R^2$ and $R^3$ independently represent hydrogen, linear or branched ($C_1$ to $C_{20}$) alkyl or the group:

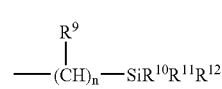

Ia $R^9$ independently is hydrogen, methyl, or ethyl; $R^{10}$, $R^{11}$, and $R^{12}$ independently represent linear or branched ($C_1$ to $C_{20}$) alkyl, linear or branched ($C_1$ to $C_{20}$) alkoxy, linear or branched ($C_1$ to $C_{20}$) alkyl carbonyloxy (e.g., acetoxy), and substituted or unsubstituted ($C_6$ to $C_{20}$) aryloxy; m is a number from 0 to 4; and n is a number from 0 to 5. In Formula I at least one of substituents $R^2$ and $R^3$ must be selected from the silyl group represented by the formula set forth under Ia.

Preferably, at least one of $R^{10}$, $R^{11}$, or $R^{12}$ is selected from a linear or branched ($C_1$ to $C_{10}$) alkoxy group and $R^9$ is hydrogen. More preferably, each of $R^{10}$, $R^{11}$, and $R^{12}$ are the same and are selected from methoxy, ethoxy, propoxy, butoxy, and pentoxy. Most preferably, n is 0 and $R^{10}$, $R^{11}$, and $R^{12}$ are each ethoxy groups, e.g., $R^2$ and/or $R^3$ is most preferably a triethoxysilyl substituent. When n is 0, it is evident that the silyl functionality is connected directly to the polycyclic ring through a silicon-carbon bond wherein the carbon atom of said silicon-carbon bond is supplied by a carbon atom on the polycyclic ring (i.e., a ring carbon atom).

In Formula I above, m is preferably 0 or 1 as represented by structures Ib and Ic, respectively, below:

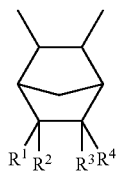

Ib

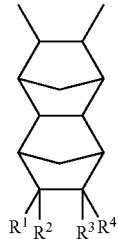

Ic wherein $R^1$ to $R^4$ are as previously defined and at least one of $R^2$ and $R^3$ must be a silyl substituent represented by Ia. Repeating units where m is 0, i.e., repeating units of structure Ib, are especially preferred.

In Formulae I, Ib, and Ic $R^1$ and $R^4$ can taken together with the two ring carbon atoms to which they are attached to represent a saturated cyclic group of 4 to 8 carbon atoms. When $R^1$ and $R^4$ are taken together to form a saturated cyclic group, the cyclic group is substituted by $R^2$ and $R^3$ at least one of which must be a silyl group represented by Ia. Generically such monomers are represented by the following structure:

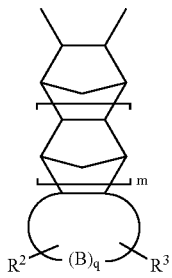

wherein B is a methylene (i.e., —CH$_2$—) group and q is a number from 2 to 6. It should be apparent that when the methylene group represented by B contains an $R^2$ or $R^3$ substituent, one of the hydrogen atoms of the —CH$_2$— group is replaced by the $R^2$ or $R^3$ substituent. Representative repeating unit structures are set forth below:

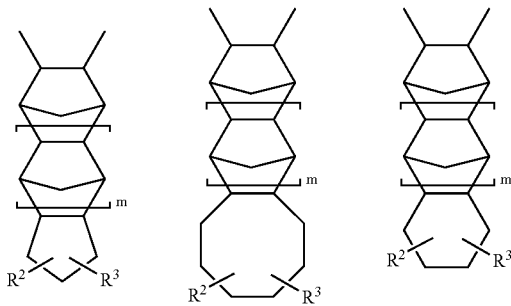

wherein $R^2$, $R^3$, and m are as previously defined.

Illustrative examples of monomers of Formula I include 5-triethoxysilyl-norbornene, 5-trimethylsilyl norbornene, 5-trimethoxysilyl norbornene, 5-methyldimethoxysilyl norbornene, 5-dimethylmethoxy norbornene.

In another embodiment of the present invention, the sacrificial polymer comprises hydrocarbyl substituted polycyclic repeating units selected from units represented by Formula II below:

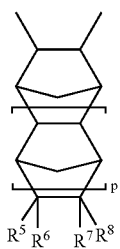

wherein $R^5$, $R^6$, $R^7$, and $R^8$ independently represent hydrogen, linear and branched ($C_1$ to $C_{20}$) alkyl, hydrocarbyl substituted and unsubstituted ($C_5$ to $C_{12}$) cycloalkyl, hydrocarbyl substituted and unsubstituted ($C_6$ to $C_{40}$) aryl, hydrocarbyl substituted and unsubstituted ($C_7$ to $C_{15}$) aralkyl, ($C_3$ to $C_{20}$) alkynyl, linear and branched ($C_3$ to $C_{20}$) alkenyl, or vinyl; any of $R^5$ and $R^6$ or $R^7$ and $R^8$ can be taken together to form a ($C_1$ to $C_{10}$) alkylidenyl group, $R^5$ and $R^8$ when taken with the two ring carbon atoms to which they are attached can represent saturated and unsaturated cyclic groups containing 4 to 12 carbon atoms or an aromatic ring containing 6 to 17 carbon atoms; and p is 0, 1, 2, 3, or 4. The hydrocarbyl substituents on the foregoing substituents are composed solely of carbon and hydrogen atoms, such as, for example, branched and unbranched ($C_1$ to $C_{10}$) alkyl, branched and unbranched ($C_2$ to $C_{10}$) alkenyl, and ($C_6$ to $C_{20}$) aryl.

Illustrative examples of hydrocarbyl substituted monomers include 2-norbornene, 5-methyl-2-norbornene, 5-hexyl-2-norbornene, 5-cyclohexyl-2-norbornene, 5-cyclohexenyl-2-norbornene, 5-butyl-2-norbornene, 5-ethyl-2-norbornene, 5-decyl-2-norbornene, 5-phenyl-2-norbornene, 5-naphthyl-2-norbornene 5-ethylidene-2-norbornene, vinyinorbornene, dicyclopentadiene, dihydrodicyclopentadiene, tetracyclododecene, methyltetracyclododecene, tetracyclododecadiene, dimethyltetracyclododecene, ethyltetracyclododecene, ethylidenyl tetracyclododecene, phenyltetracyclododecene, trimers of cyclopentadiene (e.g., symmetrical and asymmetrical trimers). An especially preferred hydrocarbyl repeating unit is derived from 2-norbornene.

In another embodiment of the invention, a sacrificial polymer useful in carrying out the invention comprises repeating units represented by Formula III below:

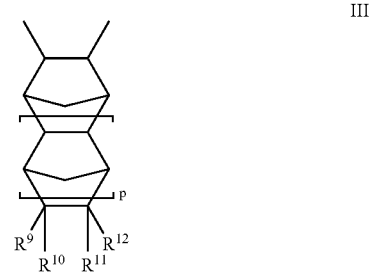

wherein $R^9$ to $R^{12}$ independently represent a polar substituent selected from the group: —(A)$_n$—C(O)OR", —(A)$_n$—OR", —(A)$_n$—OC(O)R", "(A)$_n$—OC(O)OR", —(A)$_n$—C(O)R", —(A)$_n$—OC(O)C(O)OR", —(A)$_n$—O—A'—C(O)OR", —(A)$_n$—OC(O)—A'—C(O)OR", —(A)$_n$—C(O)O—A'—C(O)OR", —(A)$_n$—C(O)—A'—OR", —(A)$_n$—C(O)O—A'—OC(O)OR", —(A)$_n$—C(O)O—A'—O—A'—C(O)OR", —(A)$_n$—C(O)O—A'—OC(O)C(O)OR", —(A)$_n$—C(R")$_2$CH(R")(C(O)OR"), and —(A)$_n$—C(R")$_2$CH(C(O)OR")$_2$. The moieties A and A' independently represent a divalent bridging or spacer radical selected from divalent hydrocarbon radicals, divalent cyclic hydrocarbon radicals, divalent oxygen containing radicals, and divalent cyclic ethers and cyclic diethers, and n is an integer 0 or 1. When n is 0 it should be apparent that A and A' represent a single covalent bond. By divalent is meant that a free valence at each terminal end of the radical are attached to two distinct groups. The divalent hydrocarbon radicals can be represented by the formula —(C$_d$H$_{2d}$)— where d represents the number of carbon atoms in the alkylene chain and is an integer from 1 to 10. The divalent hydrocarbon radicals are preferably selected from linear and branched ($C_1$ to $C_{10}$) alkylene such as methylene, ethylene, propylene, butylene, pentylene, hexylene, heptylene, octylene, nonylene, and decylene. When branched alkylene radicals are contemplated, it is to be understood that a hydrogen atom in the linear alkylene chain is replaced with a linear or branched ($C_1$ to $C_5$) alkyl group.

The divalent cyclic hydrocarbon radicals include substituted and unsubstituted ($C_3$ to $C_8$) cycloaliphatic moieties represented by the formula:

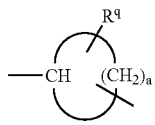

wherein a is an integer from 2 to 7 and $R^q$ when present represents linear and branched ($C_1$ to $C_{10}$) alkyl groups. Preferred divalent cycloalkylene radicals include cyclopentylene and cyclohexylene moieties represented by the following structures:

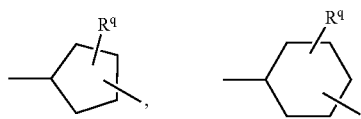

wherein $R^q$ is defined above. As illustrated here and throughout this specification, it is to be understood that the bond lines projecting from the cyclic structures and/or formulae represent the divalent nature of the moiety and indicate the points at which the carbocyclic atoms are bonded to the adjacent molecular moieties defined in the respective formulae. As is conventional in the art, the diagonal bond line projecting from the center of the cyclic structure indicates that the bond is optionally connected to any one of the carbocyclic atoms in the ring. It is also to be understood that the carbocyclic atom to which the bond line is connected will accommodate one less hydrogen atom to satisfy the valence requirement of carbon.

Preferred divalent cyclic ethers and diethers are represented by the structures:

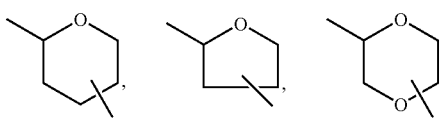

The divalent oxygen containing radicals include ($C_2$ to $C_{10}$) alkylene ethers and polyethers. By ($C_2$ to $C_{10}$) alkylene ether is meant that the total number of carbon atoms in the divalent ether moiety must at least be 2 and can not exceed 10. The divalent alkylene ethers are represented by the formula -alkylene-O-alkylene- wherein each of the alkylene groups that are bonded to the oxygen atom can be the same or different and are selected from methylene, ethylene, propylene, butylene, pentylene, hexylene, heptylene, octylene, and nonylene. The simplest divalent alkylene ether of the series is the radical —$CH_2$—O—$CH_2$—. Preferred polyether moieties include divalent radicals of the formula:

—$(CH_2(CH_2)_xO)_y$— wherein x is an integer from 0 to 5 and y is an integer from 2 to 50 with the proviso that the terminal oxygen atom on the polyether spacer moiety can not be directly linked to a terminal oxygen atom on an adjacent group to form a peroxide linkage. In other words, peroxide linkages (i.e., —O—O—) are not contemplated when polyether spacers are linked to any of the terminal oxygen containing substituent groups set forth under $R^9$ to $R^{12}$ above.

$R^9$ to $R^{12}$ can also independently represent hydrogen, linear and branched ($C_1$ to $C_{10}$) alkyl, so long as at least one of the remaining $R^9$ to $R^{12}$ substituents is selected from one of the polar groups represented above. In the formula above p is an integer from 0 to 5 (preferably 0 or 1, more preferably 0). R" independently represents hydrogen, linear and branched ($C_1$ to $C_{10}$) alkyl (e.g., —$C(CH_3)$), —$Si(CH_3)$, —$CH(R^p)$ $OCH_2CH_3$, —$CH(R^p)OC(CH_3)_3$, linear and branched ($C_1$ to $C_{10}$) alkoxyalkylene, polyethers, monocyclic and polycyclic ($C_4$ to $C_{20}$) cycloaliphatic moieties, cyclic ethers, cyclic ketones, and cyclic esters (lactones). By ($C_1$ to $C_{10}$) alkoxyalkylene is meant that a terminal alkyl group is linked through an ether oxygen atom to an alkylene moiety. The radical is a hydrocarbon based ether moiety that can be generically represented as -alkylene-O-alkyl wherein the alkylene and alkyl groups independently contain 1 to 10 carbon atoms each of which can be linear or branched. The polyether radical can be represented by the formula:

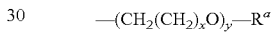

—$(CH_2(CH_2)_xO)_y$—$R^a$ wherein x is an integer from 0 to 5, y is an integer from 2 to 50 and $R^a$ represents hydrogen or linear and branched ($C_1$ to $C_{10}$) alkyl. Preferred polyether radicals include poly(ethylene oxide) and poly(propylene oxide). Examples of monocyclic cycloaliphatic monocyclic moieties include cyclopropyl, cyclobutyl, cyclopentyl, cyclohexyl, dicyclopropylmethyl (Dcmp) and dimethylcyclopropylmethyl (Dmcp), and the like. Examples of cycloaliphatic polycyclic moieties include, norbornyl, adamantyl, tetrahydrodicyclopentadienyl (tricyclo[5.2.1.0$^{2,6}$]decanyl), and the like. Examples of cyclic ethers include tetrahydrofuranyl and tetrahydropyranyl moieties. An example of a cyclic ketone is a 3-oxocyclohexanonyl moiety. An example of a cyclic ester or lactone is a mevalonic lactonyl moiety. Structures for representative cyclic groups set forth above include:

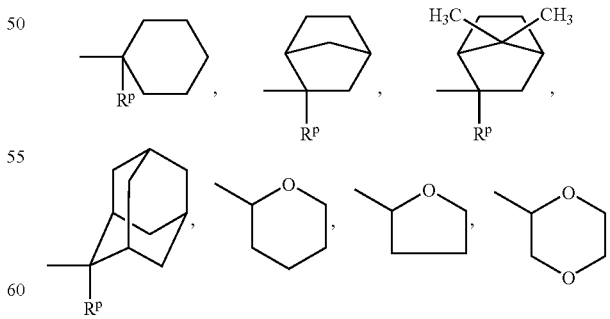

wherein $R^p$ in the above formulae and cyclic groups represents hydrogen or a linear or branched ($C_1$ to $C_5$) alkyl group. The Dcpm and Dmcp substituents are represented, respectively, as follows:

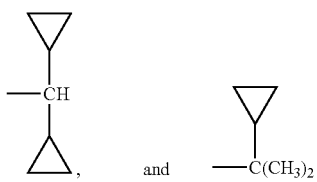

The sacrificial polymers useful in practicing the present invention preferably encompass homopolymers and copolymers containing random repeating units derived from a monomer unit or monomer units represented by Formula I, or homopolymers or copolymers containing random repeating units derived from monomer unit or units represented by Formula II, homopolymers or copolymers containing repeating units derived from a monomer unit(s) represented by Formula III and copolymers comprising a combination of repeating units represented by Formulae I and II, Formulae I and III, Formulae II and III or Formulae I, II and III.

Preferred sacrificial polymers according to the present invention may contain from about 0.1 to 100 mole percent of silyl functional polycyclic repeating units, preferably from about 1 to 50 mole percent, more preferably from about 3 to 25 mole percent, and most preferably from about 5 to 20 mole percent, with the remainder of the polymer preferably comprising repeating units described under Formula II and/or Formula III. An especially preferred polymer comprises repeating units polymerized from norbornene and triethoxysilylnorbonene in a mole percent ratio of 80/20 norbornene/triethoxysilyinorbonene.

Preferred sacrificial polymers according to present invention are addition polymers comprising polycyclic repeating units that are connected to one another via 2,3-linkages that are formed across the double bond contained in the norbornene-type moiety of the prepolymerized polycyclic monomer.

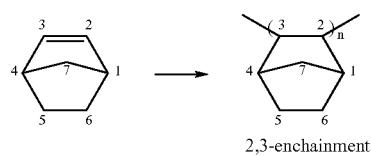

2,3-enchainment

The polymers may be polymerized from appropriately functionalized norbornene-type monomers in the presence of a single or multi-component Group VIII transition metal catalyst system as described in International Patent Application Publication No. WO 97/20871 to The BFGoodrich Company, published on Jun. 12, 1997, which is hereby incorporated herein by reference in its entirety.

The polynorbornene-type polymer is particularly beneficial because it has a high (>350° C.) and sufficient thermal stability to accommodate a number of commonly employed and other semiconductor manufacturing steps such as plasma enhanced chemical vapor deposition (PECVD) Of $SiO_2$ and low temperature copper annealing, and has a decomposition temperature close to its $T_g$, thereby limiting movement which might damage the semiconductor device.

It is believed that the polycycloolefinic polymers utilized in practicing this invention are uniquely suited as sacrificial materials in semiconductor device manufacturing because the material thermally decomposes close to its $T_g$. In other words, the polymer remains mechanically stable until the decomposition temperature is reached enabling the polymer to endure the rather harsh processing steps (e.g., repeated heat cycles) during semiconductor manufacture. The disadvantage with the prior art polymers is that their $T_g$'s are well below their decomposition temperatures, leading to mechanical failue before the decomposition temperature is reached.

It has been found that by incorporating polycycloolefinic repeating units that contain pendant hydrocarbyl (Formula II) and/or pendant polar (Formula III) substituents into the sacrificial polymer backbone the decomposition temperatures of the silyl substituted polycycloolefinic polymer can be significantly lowered. The decomposition temperature of polymers containing 80/20 mole percent of norbornene/triethoxysilynorbonene (approximately 430° C.) can be lowered by approximately 30° C. by replacing the norbornene repeating units in the copolymer with repeating units containing pendant linear and/or branched ($C_1$ to $C_{20}$) alkyl substituents. For example, the thermal decomposition temperature for a copolymer containing butylnorbornene/triethoxysilylnorbornene in a mole percent ratio of 95/5 is lowered to 405° C. We expect that the decomposition temperature of the copolymer can be lowered even further (up to approximately 100° C.) by replacing the norbornene repeating units in the copolymer with repeating units containing the polar substituents described under Formula III. Homopolymers of norbornyl acetate and norbornyl ethyl carbonate have thermal decomposition temperatures of 356° C. and 329° C., respectively. The polar groups include ester, carbonate, and acetate substituents and the like. To effect lower decomposition temperatures of the silyl substituted polymers, the polymer should contain about 50 mole percent of polycyclic repeating units having pendant hydrocarbyl or polar functionality, preferably greater than 50 mole percent, more preferably 51 to 99 percent, still more preferably 55 to 95 mole percent, even more preferably 65 to 80 mole percent.

The aforesaid sacrificial polymers can be heated to above their decomposition temperature, typically in the range of about 380° C. to about 450° C., to cause the polymers to decompose into their decomposition products which can diffuse through various materials used to form semiconductor devices including air gaps. The materials include polymer dielectrics such as silicon dioxide, silicon nitride, silicon oxynitride, and polyimides, for example, Olin-Ciba Geigy (OCG) Probimide® 293 and 412, Amoco Ultradel® 7501 and DuPont Pyralin® 2545. Particularly useful polymers are those that are photosensitive, as will become evident from the following description of other exemplary methods illustrating other aspects of the invention.

The forgoing methodology can be applied to form air gaps in a variety of electrical devices and particularly in relation to electrical interconnects in integrated circuits and other electronic packages. The air gaps may be used on opposite sides of a conductive member or members in both interplanar and intraplanar arrangements to provide a low dielectric insulator with dielectric constants generally less than about 2, more preferably less than about 1.5, still more preferably less than about 1.25 and most preferably about 1.0. The lower the capacitance, the faster the electrical signal can be transmitted through the conductors and the lower the crosstalk between conductors.

As above indicated, the aforesaid polynorbornene polymers are desirable because generally they leave little or essentially no residue. However, some residue may be desirable. For example, a thin film of $SiO_2$ (or $TiO_2$ if Ti is used in place of Si in the functionalized norbornene) may be left to insulate the electrical conductors or control corrosion. Actual tests have shown about 100 Å of residue when 5 μm of material are decomposed.

Figure 2A:
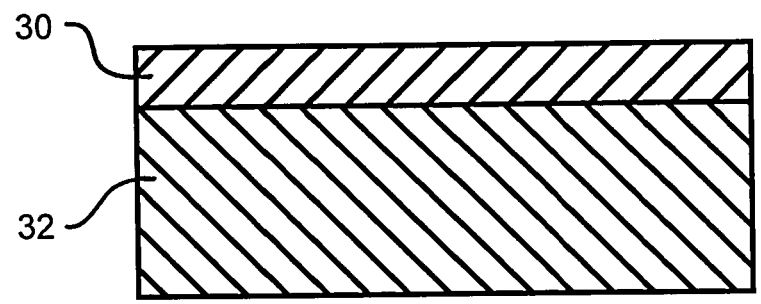
FIGS. 2A-2F are diagrammatic cross-sections of a portion of a semiconductor structure, illustrating several steps of a method according to another aspect of the invention.
Figure 2B:
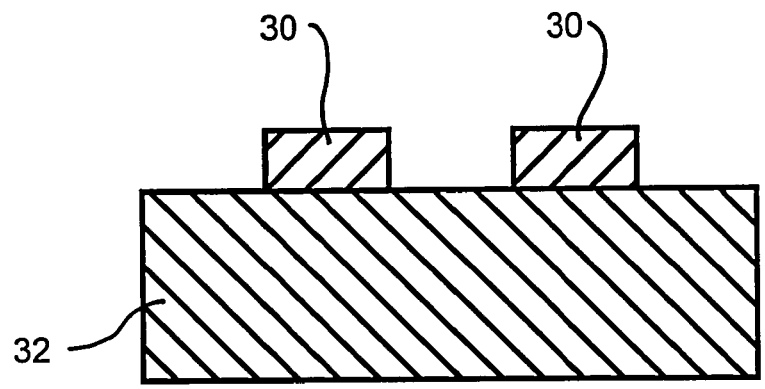

In FIGS. 2A-2F, a preferred method of forming an air gap or region between two conductive regions or elements, such as metal lines, is diagrammatically illustrated. In FIGS. 2A and 2B, a patterned layer of sacrificial material 30, preferably the aforesaid polynorbornene-type polymer, is formed on a substrate 32. The substrate 32 may have patterns already on it, or it may be an unpatterned material. The substrate may be a base layer or a layer of material overlying a base layer such as an insulating layer of $SiO_2$ that may overlie the devices on an integrated circuit chip (not shown). By way of specific example, the substrate may be a semiconductor wafer which may, for example, contain transistors, diodes, and other semiconductor elements (as are well known in the art).

As depicted in FIG. 2A, a uniform layer of the sacrificial material 30 is deposited on the substrate 32. This may be done in any suitable manner, for example, by spin coating, spraying, meniscus, extrusion or other coating methods, by pressing or laying a dry film laminate onto the substrate, etc.

In FIG. 2B, the layer of sacrificial material is patterned to produce the patterned layer of the sacrificial material 30, the pattern of which corresponds to the desired pattern of one or more air gaps to be formed in the semiconductor device. Any suitable technique can be used to pattern the layer of sacrificial material, including, for example, laser ablating, etching, etc. The sacrificial material may be of a type that is or may be made photosensitive to facilitate patterning.

Figure 2C:
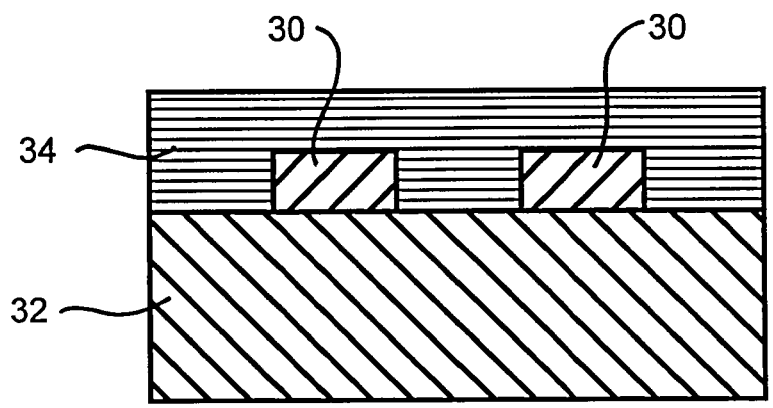

In FIG. 2C, a layer of conductive material 34, particularly metal, is deposited over the patterned layer of sacrificial material 30. This may be done by any suitable technique including, for example, metal sputtering, chemical vapor deposition (CVD), physical vapor deposition (PVD), electroplating, electroless plating, etc.

Figure 2D:
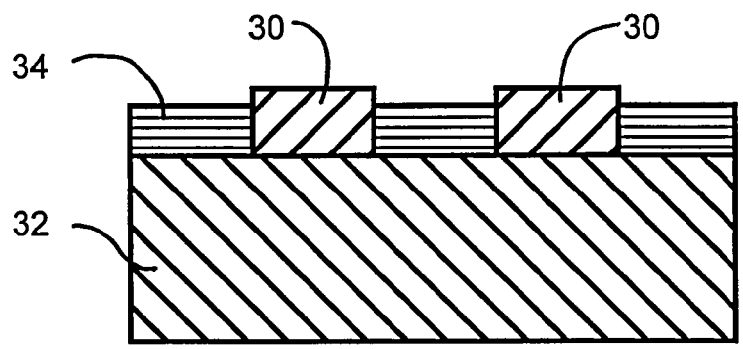

In FIG. 2D, the metal layer 34 is planarized as needed by any suitable technique including, for example, chemical-mechanical polishing (CMP). If CMP is used with the above-described polynorbornene-type polymer, and other polymers as well, a layer of silicon dioxide preferably is applied to the surface of the sacrificial layer to provide an etch stop.

Figure 2E:
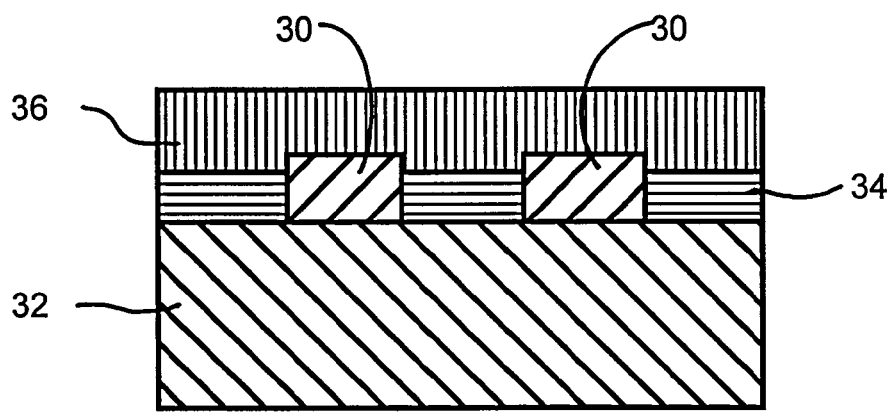

In FIG. 2E, a permanent dielectric 36 is deposited over the patterned layer of sacrificial material 30 with the metal inlay 34. The permanent dielectric 36 is deposited as a solid layer and covers the sacrificial layer 30 and at least the tops of the metal leads 34. The permanent dielectric layer may be planarized before or after removal of the sacrificial material. The permanent dielectric layer, for example, may be silicon dioxide, polyimide or other material. The permanent dielectric layer may be deposited by spin coating, spray coating or meniscus coating (typically using the sacrificial material dissolved in a solvent), chemical vapor deposition, plasma enhanced chemical vapor deposition, sol-gel process, or other method. As seen in FIG. 2E, the metal layer can be conveniently formed with a height less than the height of the adjacent sacrificial material. As will be appreciated, this will result in air gaps that extend above the tops of the metal leads, as is desirable to reduce capacitive coupling. Also, the substrate could have trenches formed therein in a pattern corresponding to the pattern of the sacrificial material, so that the resultant air gaps will extend below the metal leads located on lands on the substrate between the trenches, as illustrated in FIG. 2G.

Figure 2F:
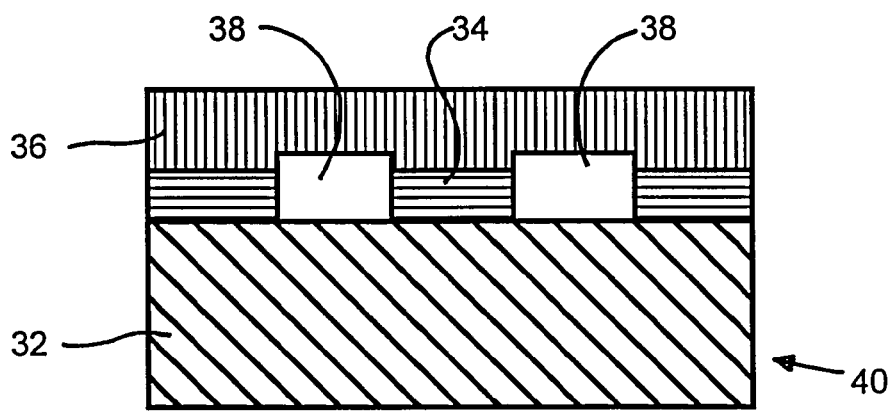

The sacrificial material 30 is removed through the permanent dielectric layer 36 to form the air gaps 38 as shown in FIG. 2F. The removal of the sacrificial material preferably is accomplished by thermal decomposition and passage of one or more of the decomposition products through the permanent dielectric layer 36 by diffusion. As above indicated, the preferred polynorbornene-type polymer will undergo thermal decomposition at temperatures on the order of about 450° C., and lower, with essentially no residue being left in the air gaps of the resultant semiconductor structure 40. Also, the decomposition products are diffusible through many dielectric materials useful forming the permanent dielectric layer, including in particular polyimides.

The rate of decomposition should be slow enough so that diffusion through the permanent dielectric will occur. Diffusion typically arises from a pressure buildup within the air gap. This pressure build up should not be so great as to exceed the mechanical strength of the permanent dielectric. Increased temperature will generally aid diffusion as diffusivity of gas though the permanent dielectric will normally increase with temperature.

Preferably, the sacrificial material is decomposed at a relatively slow rate. The heating rate preferably is between about 0.5 to 10° C./minute, more preferably between when 1 to 5° C./minute and most preferably about 2 to 3° C./minute.

As will be appreciated, the air gaps may contain residual gas although generally the residual gas will eventually exchange with air. However, steps may be taken to prevent such exchange, or dispose a different gas (a noble gas for example) or a vacuum in the air gaps. For example, the semiconductor structure may be subjected to vacuum conditions to extract any residual gas from the air gaps by diffusion or other passage through the overcoat layer 24 or otherwise, after which the semiconductor structure may be coated by a suitable sealing material blocking any further passage of gases through the overcoat layer. Before the semiconductor structure is sealed, it may be subjected to a controlled gas atmosphere, such as one containing a noble gas, to fill the air gaps with such gas.

As will be appreciated, further processing steps may be performed on the semiconductor structure 40, for example to form additional layer of interconnection in the semiconductor device.

Those skilled in the art will also appreciate that other techniques may be employed to remove the sacrificial material, although less desirable and/or dictated by the type of sacrificial material utilized. The sacrificial material could be a photoresist that will decompose in oxygen (or more generally air or some other oxygen-containing atmosphere, or including an oxygen plasma or ozone). In connection therewith, a permanent layer may comprise, for example, a silica-based xerogel with a 10-90% porosity enabling passage of the oxygen into contact with the photoresist. The oxygen moves through the silica-based xerogel to reach and react with the photoresist to convert it to a gas that passes out through the silica-based xerogel.

Figure 3A:
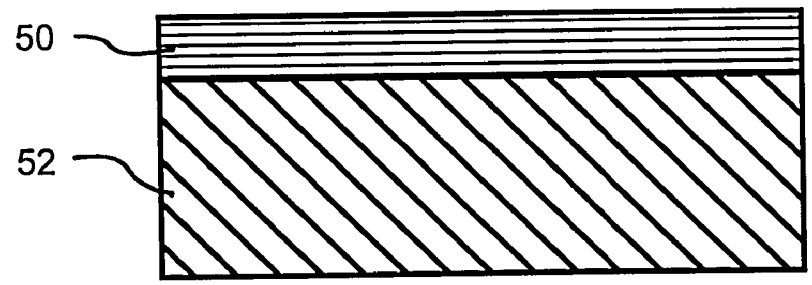
FIGS. 3A-3F are diagrammatic cross-sections of a portion of a semiconductor structure, illustrating several steps of a method according to further aspect of the invention.
Figure 3B:
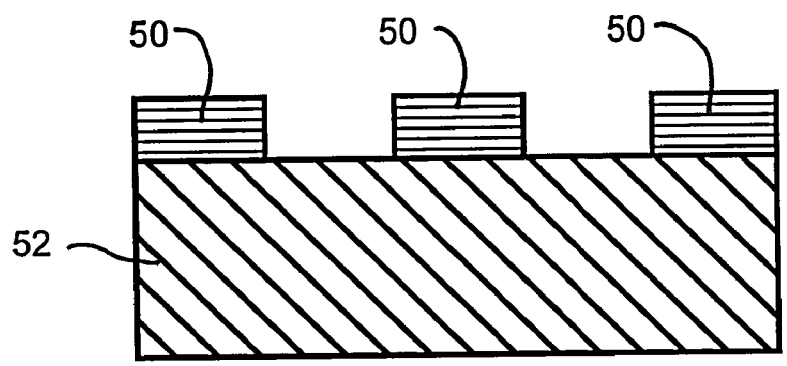

In FIGS. 3A-3F, a method of forming an air gap or region between two conductive regions or elements, such as metal lines, according to another aspect of the invention, is diagrammatically illustrated. In FIGS. 3A and 3B, a patterned layer of conductive material 50, such as aluminum, copper, gold, etc., is formed on a substrate 52. Again, the substrate may be a base layer or a layer of material overlying a base layer such as an insulating layer of $SiO_2$ that may overlie the devices on an integrated circuit chip (not shown). By way of specific example, the substrate may be a semiconductor wafer which may, for example, contain transistors, diodes, and other semiconductor elements (as are well known in the art).

As depicted in FIG. 3A, a uniform layer of the conductive material 50 is deposited on the substrate. This may be done in any suitable manner, for example, by metal sputtering, chemical vapor deposition (CVD), plating (particularly electroless plating) or other methods. In FIG. 3B, the layer of conductive material 50 is patterned to produce a pattern of the conductive material corresponding to the desired pattern of one or more electrical conductors, e.g. metal lines, leads, regions, etc., to be formed in the semiconductor device. Any suitable technique can be used to pattern the layer of conductive material, including, for example, laser ablating, etching, etc.

Figure 3C:
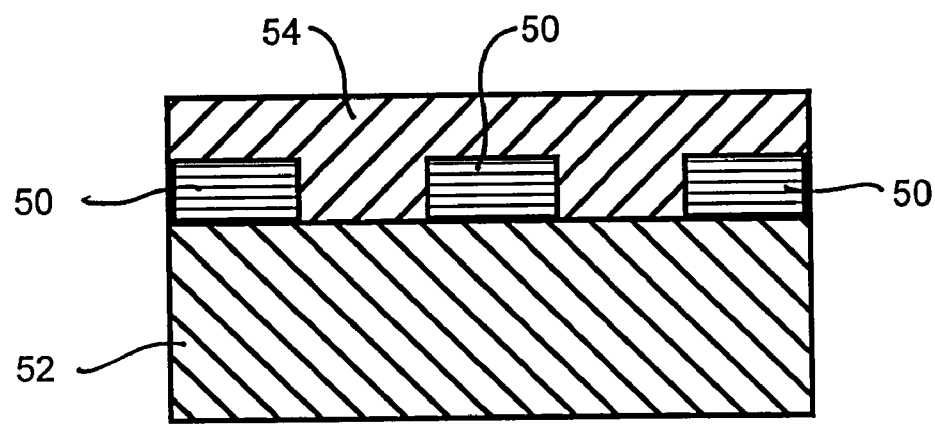

In FIG. 3C, a layer of sacrificial material 54, preferably the aforesaid polynorbornene-type polymer, is deposited over the patterned layer of conductive material 50. This may be done by any suitable technique including, for example, spin coating, spraying, meniscus, extrusion or other coating methods, by pressing or laying a dry film laminate onto the substrate, etc.

Figure 3D:
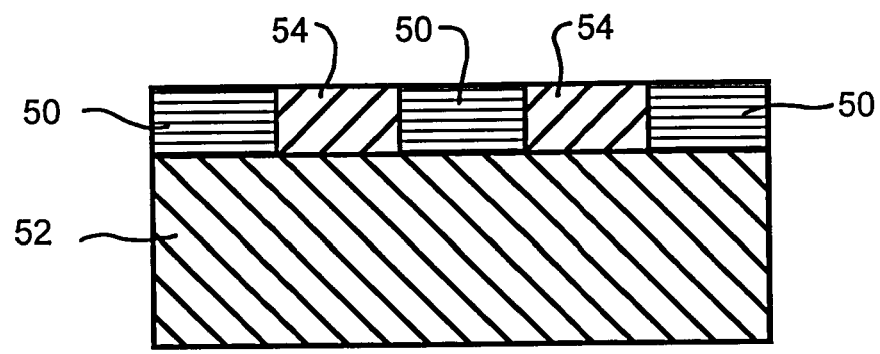

In FIG. 3D, any excess sacrificial material overlying the tops of the conductors 50 is removed and the sacrificial layer is planarized, as needed, by any suitable technique including, for example, CMP, reactive ion etching, etc.

Figure 3E:
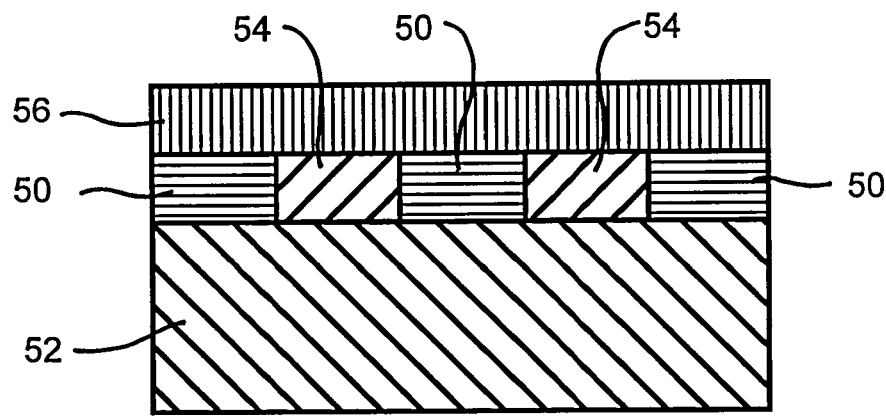

In FIG. 3E, a permanent dielectric 56 is deposited over the patterned conductive layer with the sacrificial material inlay. The permanent dielectric is deposited as a solid layer and covers the sacrificial layer and at least the tops of the metal leads of the conductive layer.

Figure 3F:
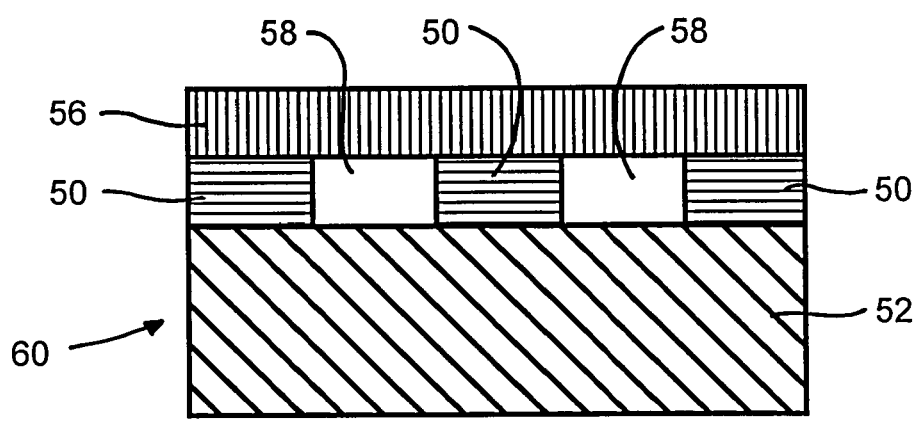

Then, like in the manner described above in respect of the method illustrated in FIGS. 2A-2F, the sacrificial material is removed through the permanent dielectric layer to form the air gaps 58 as shown in FIG. 3F. Again, the removal of the sacrificial material preferably is accomplished by thermal decomposition and passage of one or more of the decomposition products through the permanent dielectric layer 56 by diffusion. As above indicated, the preferred polynorbornene-type polymer will undergo thermal decomposition at temperatures on the order of about 400° C., and lower, with essentially no residue being left in the air gaps in the resultant semiconductor structure 60. Also, the decomposition products are diffusible through many dielectric materials useful in forming the permanent dielectric layer, including in particular polyimides. Also, as above indicated, other techniques may also be employed to remove the sacrificial material, such as the other techniques described above.

Figure 4A:
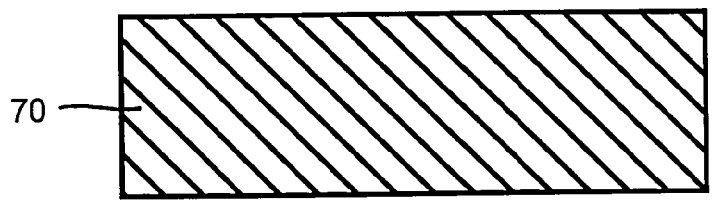
FIGS. 4A-4H are diagrammatic cross-sections of a portion of a semiconductor structure, illustrating several steps of a specific example of a method according to the invention.

Referring now to FIGS. 4A-4H, there is illustrated a specific example of a method of forming air gaps (tunnels) in an oxide using the preferred polynorbornene-type polymer. This exemplary specific method involved the steps of:

1. In FIG. 4A, a clean, polished silicon wafer 70 is used (although as above indicated many other substrates could be used including ceramic or metal materials).

Figure 4B:
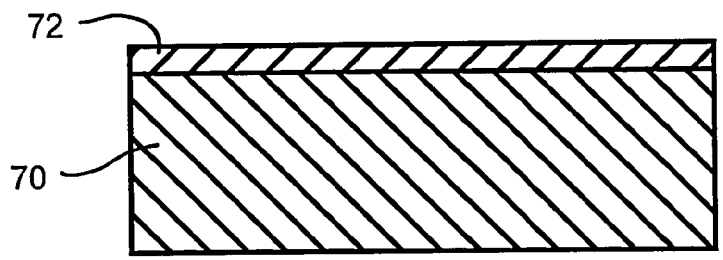

2. In FIG. 4B, a sacrificial material 72, Avatrel® polynorbornene-type polymer, is spin coated onto the wafer. Spin coating involves rotating the wafer, for example at 1000 to 4000 rotations per minute, and dispensing a solution of the polynorbornene-type polymer and an appropriate solvent in which the polynorbornene-type polymer is dissolved. The solvent may be mesitylene, although other suitable solvents may be used such as decalin or other hydrocarbon solvent. When pendant polar substituents are present on the sacrificial polymer, PGMEA can be employed as a suitable solvent. The spin coating produces a uniform, thin film on the wafer having a thickness of 0.2 to 6 micrometers, with a uniformity less than ±5% across the sample. However, thicker or thinner films could be applied as desired for a given application. After the coating is applied, the wafer is baked in an oven in air at about 100° C. to remove the solvent. The polynorbornene-type polymer is then baked at 200 to 300° C. in nitrogen for one hour to remove the solvent.

Figure 4C:
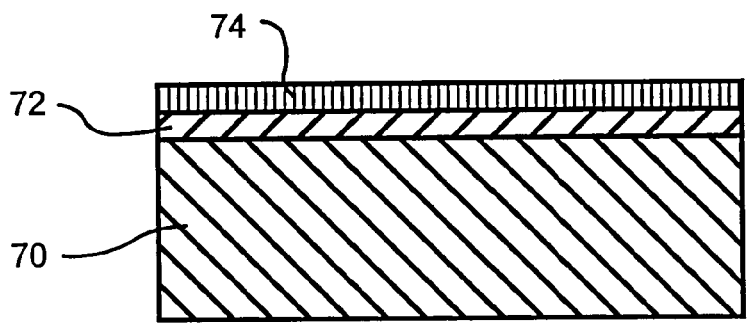

3. In FIG. 4C, a layer of plasma enhanced chemical vapor deposited (PECVD) silicon dioxide 74 is deposited on the surface of the polynorbornene-type polymer 72 using standard conditions. Suitable gases are silane and nitrous oxide.

Figure 4D:
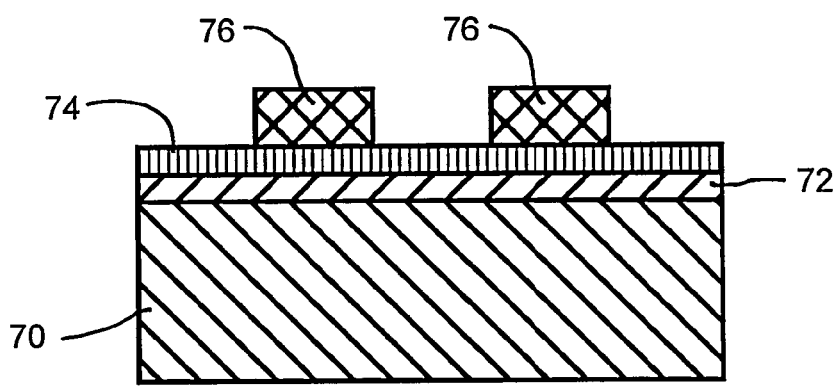

4. In FIG. 4D, a photoresist 76 is deposited onto the wafer by spin coating, soft baked, exposed, developed and then hard baked under standard conditions following manufacturer's specifications.

Figure 4E:
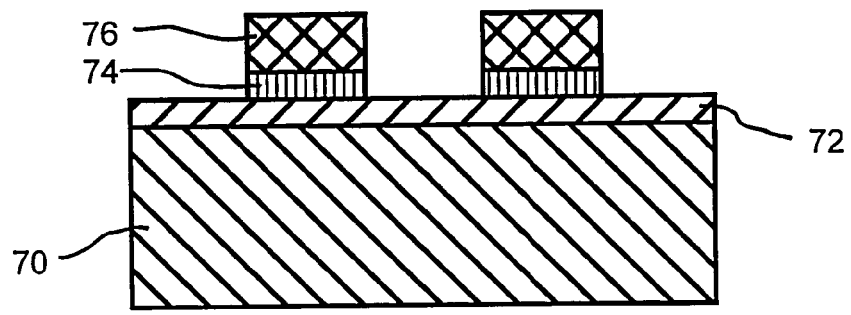
Figure 4F:
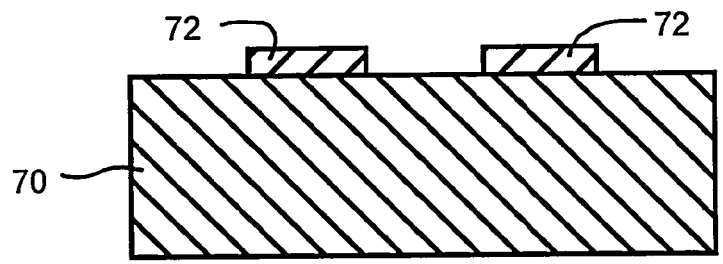

5. In FIG. 4E, the sample is reactive ion etched. The pattern in the photoresist 76 is transferred to the silicon dioxide 74 by first using a fluorine containing plasma. The polynorbornene-type polymer 72 is then etched by using an oxygen/fluorine plasma. During the process, the photoresist is also etched. After the polynorbornene-type polymer is etched in the exposed areas, a fluorine plasma is used to strip the silicon dioxide mask. The sample now has only patterned polynorbornene-type polymer 72 as shown in FIG. 4F.

Figure 4G:
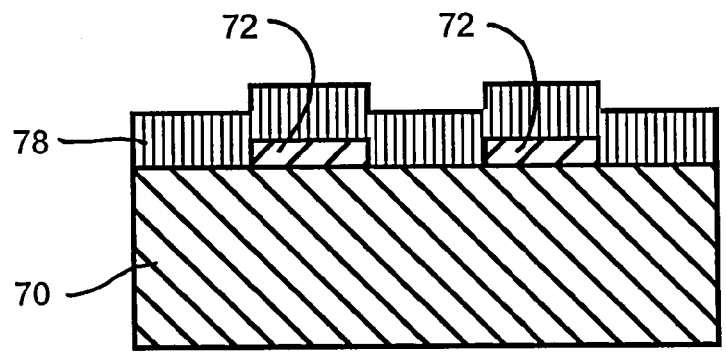

6. In FIG. 4G, silicon dioxide 78 (although other permanent dielectric materials could be used) is deposited onto the patterned polynorbornene-type polymer 72. The process is similar to that used in Step 3 above to deposit the silicon dioxide on the surface of the polynorbornene-type polymer. The polynorbornene-type polymer is now totally encapsulated in a permanent dielectric material 78.

Figure 4H:
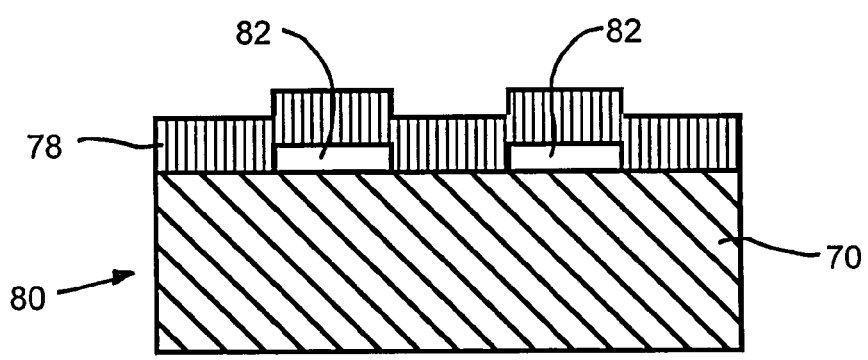

7. In FIG. 4H, the sample is heated to a temperatures greater than the decomposition temperature of the polynorbornene-type polymer 72. The sacrificial material decomposes and one or more of the gaseous decomposition products diffuse out through the overcoat material 78.

8. The result is an oxide composite 80 including air gaps 82 completely surrounded by dielectric material 78.

Figure 5A:
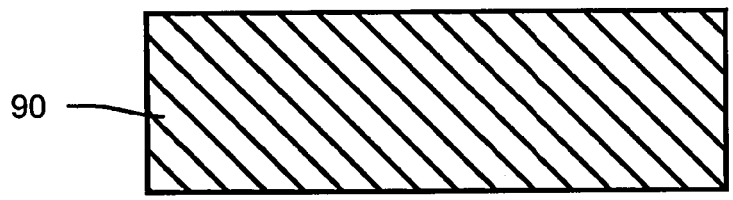
FIGS. 5A-5J are diagrammatic cross-sections of a portion of a semiconductor structure, illustrating several steps of another specific example of a method according to the invention.

Referring now to FIGS. 5A-5H, there is illustrated a specific example of a method of forming air gaps between metal lines of an electrical interconnect device or layer using the preferred polynorbornene-type polymer. This exemplary specific method involved the steps of:

1. In FIG. 5A, a clean, polished silicon wafer 90 is used.

Figure 5B:
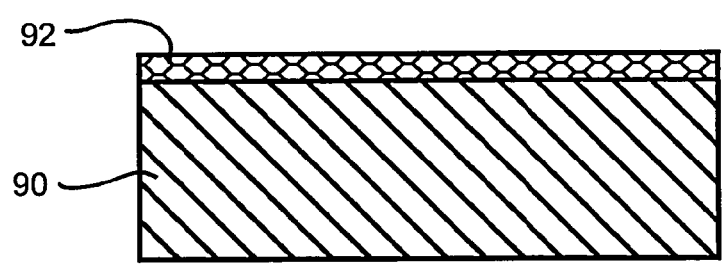
Figure 5C:
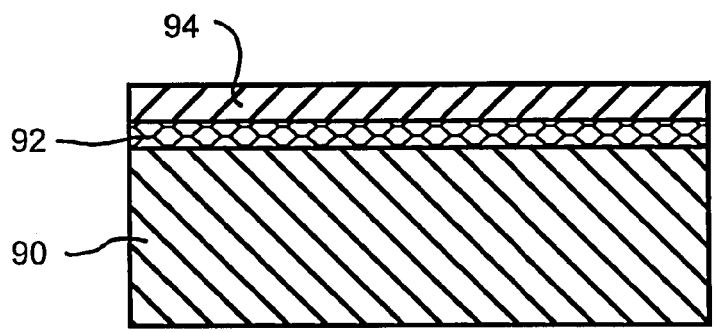
Figure 5D:
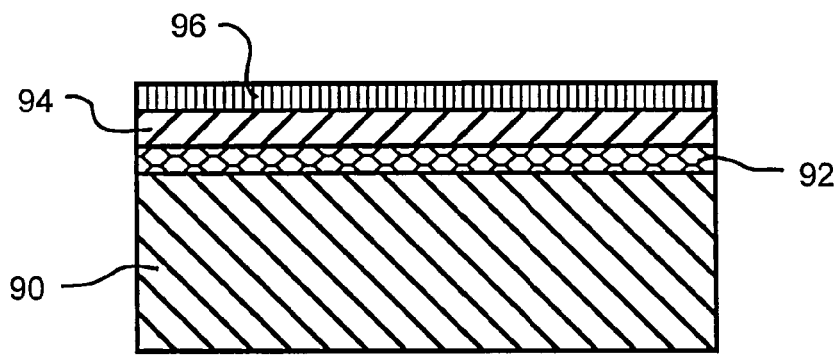
Figure 5E:
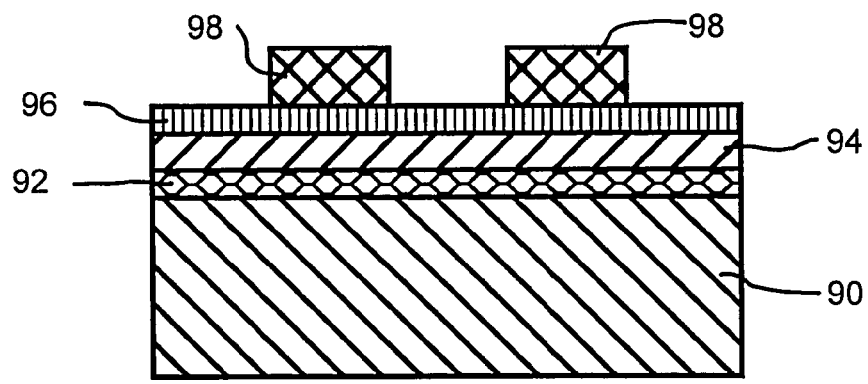
Figure 5F:
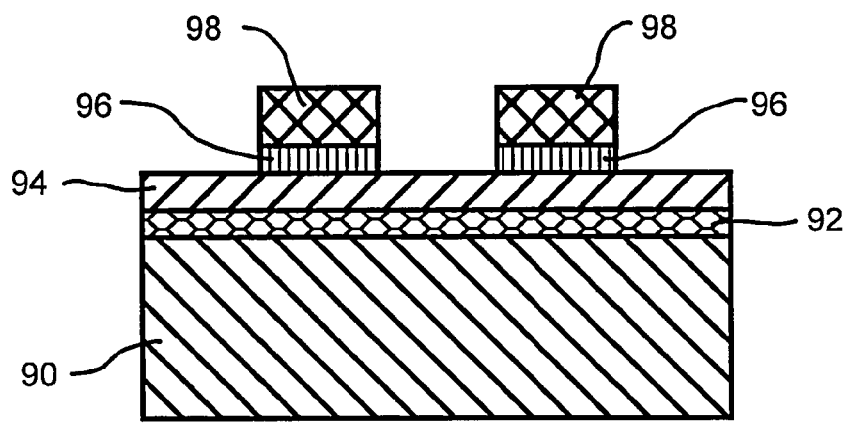

2. In FIG. 5B, a 1000 Å chromium layer followed by 2000A of gold is sputtered onto the wafer 90 to form a composite chromium/gold layer 92. The sputtering may use direct current (DC) sputtering.

3-7. In FIGS. 5C-F, a layer of polynorbornene-type polymer 94 is applied and patterned using silicon dioxide 96 and photoresist 98 as described above in Steps 3-7 of the method illustrated in FIGS. 4A-H.

Figure 5G:
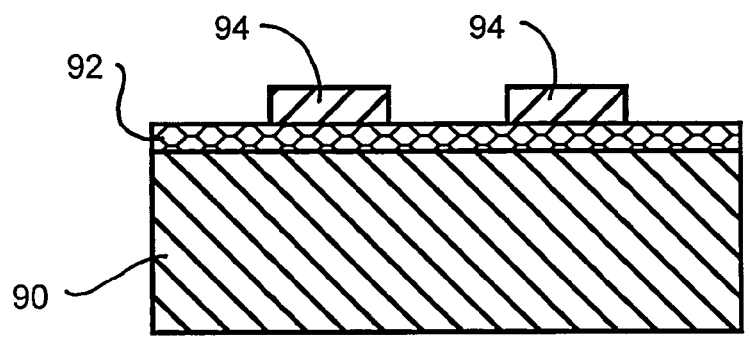

8. In FIG. 5G, the sample is similar to the sample at Step 6 of the method illustrated in FIGS. 4A-H, except that a Cr/Au layer 92 lies under the polynorbornene-type polymer 94.

Figure 5H:
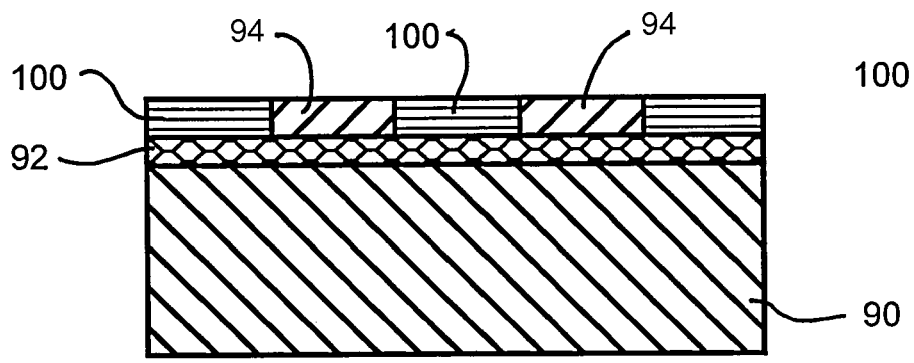

9. In FIG. 5H, gold is plated until its height is the same as the height of the polynorbornene-type polymer 94. The Cr/Au layer 92 serves as an electrical contact and base for the plating of gold between the regions of polynorbornene-type polymer 94. The electroplating may be done in a conventional, pH+7.2 potassium gold cyanide bath using a phosphate buffer.

Figure 5I:
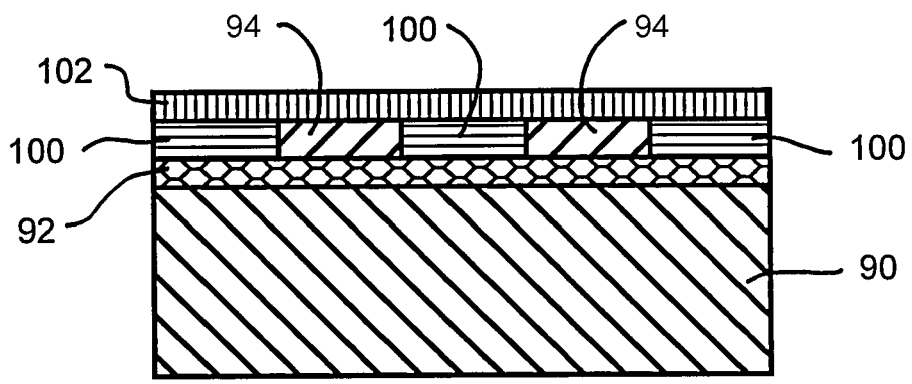

10. In FIG. 5I, the gold layer 100 and sacrificial layer 94 are coated with PECVD silicon dioxide 102, just as in Step 7 of the method illustrated in FIGS. 4A-H.

Figure 5J:
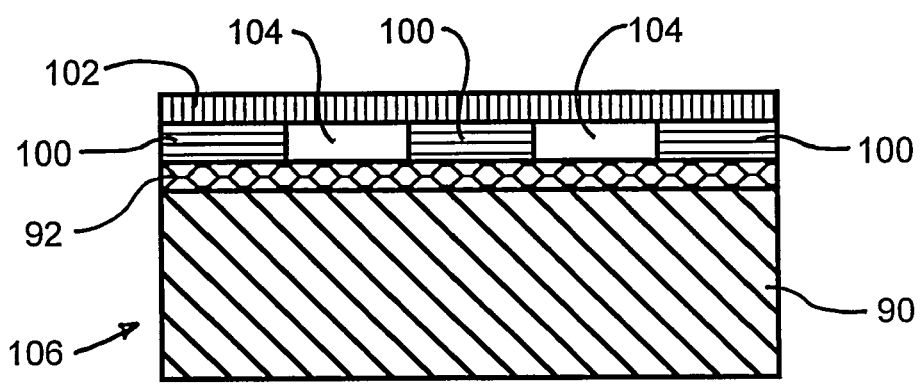

11. In FIG. 5J, the sample is heated to decompose the polynorbornene-type polymer 94 and form one or more air gaps 104 between adjacent metal lines 100 in the resultant semiconductor structure 106.

Alternative air-gap structures may use various ways of forming the metal pattern so that it is not shorted together. First, electroless plating of metal may replace the electroplating of metal. Second, the metal pattern may be first formed on the silicon wafer (plated to its full height), and then the sacrificial material may be deposited. The sacrificial material covering the metal pattern then may be removed before the permanent dielectric is deposited, as by chemical mechanical polishing, or other techniques.

Reference herein is made to passage of the decomposition products of the sacrificial layer through the permanent layer. This broadly is intended to encompass passage in any manner, including though holes or passages in the permanent layer that may later be closed. However, the preferred mechanism is by diffusion through a solid permanent layer.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described integers (components, assemblies, devices, compositions, etc.), the terms (including a reference to a "means") used to describe such integers are intended to correspond, unless otherwise indicated, to any integer which performs the specified function of the described integer (i.e., that is functionally equivalent), even though not structurally equivalent to the disclosed structure which performs the function in the herein illustrated exemplary embodiment or embodiments of the invention. In addition, while a particular feature of the invention may have been described above with respect to only one of several illustrated embodiments, such feature may be combined with one or more other features of the other embodiments, as may be desired and advantageous for any given or particular application.

What is claimed is:

1. A semiconductor device comprising:
   a substrate;
   a patterned layer of conductive material disposed on the substrate and having a region thereof bordered by air gaps; and
   an overcoat layer overlying the patterned layer of conductive material and the air gap, the overcoat layer having a portion thereof overlying the conductive material in the region bordered by the air gaps, said portion extending below the height of the adjacent air gaps, and the air gaps are of uniform width over the height thereof with said gaps having upper sides that are parallel to the planar extent of the substrate.

2. The semiconductor device of claim 1, wherein the conductive material in the region bordered by the air gaps forms a conductive lead of the semiconductor device.

3. The semiconductor device of claim 1, wherein the patterned layer of conductive material includes a plurality of regions bordered by respective air gaps, and the overcoat layer has portions thereof overlying the conductive material in the regions bordered by the air gaps, and said portions extend below the height of relatively adjacent air gaps.

4. The semiconductor device of claim 1, wherein the overcoat layer includes a dielectric material.

5. The semiconductor device of claim 1, wherein a surface of the conductive material adjacent a respective air gap is covered by a film of non-conducting material.

6. The semiconductor device of claim 5, wherein the non-conducting material is $SiO_2$ or $TiO_2$.

7. The semiconductor device of claim 5, wherein the film of non-conducting material controls corrosion of the surface of the conductive material covered by the film.

8. The semiconductor device of claim 5, wherein the film has a thickness of about 100 Å.

9. The semiconductor device of claim 1, wherein the semiconductor device is formed by removing a sacrificial material from a pre-cursor made in accordance with a method comprising the steps of:
   (A) forming a patterned layer of the sacrificial material on a substrate corresponding to a pattern of air gaps to be formed in the semiconductor structure;
   (B) depositing the conductive material on the substrate within regions bordered by the sacrificial material with the conductive material being formed with a height less than the height of the adjacent sacrificial material; and
   (C) forming an overcoat layer of material overlying the patterned layer of sacrificial material and the conductive material in the regions bordered by the sacrificial material, the overcoat layer having portions thereof overlying the conductive material in respective said regions bordered by the sacrificial material, and said portions extending below the height of the adjacent sacrificial material, whereby the height of the one or more areas of sacrificial material exceeds the height of the one or more areas of second material.

10. The semiconductor device of claim 1, wherein the semiconductor device is formed by removing a sacrificial material from a pre-cursor comprising:
    a substrate;
    a patterned layer of conductive material on the substrate,
    a patterned layer of the sacrificial material on the substrate, the patterned layer of sacrificial material being greater in height than the patterned layer of conductive material; and
    an overcoat layer overlying the patterned layer of conductive material and the patterned layer of sacrificial material, the overcoat layer having a portion thereof overlying the conductive material in a region bordered by the sacrificial material, and said portion extending below the height of the adjacent sacrificial material.

11. A semiconductor device comprising:
    a substrate;
    a patterned layer of conductive material disposed on the substrate and having a region thereof bordered by air gaps; and
    an overcoat layer overlying the patterned layer of conductive material and the air gap, the overcoat layer having a portion extending below the height of the adjacent air gaps having a portion thereof overlying the conductive material in the region bordered by the air gaps, and said portion extending below the height of the adjacent air gaps;
    wherein the adjacent air gaps extend below the bottom surface of the conductive material with said gaps having upper sides that are parallel to the substrate.

12. A semiconductor device comprising:
    a substrate;
    a patterned layer of conductive material disposed on the substrate and having a region thereof bordered by air gaps having upper sides that are parallel to the substrate; and
    an overcoat layer overlying the patterned layer of conductive material and the air gap, the overcoat layer having a portion thereof overlying the conductive material in the region bordered by the air gaps; and
    wherein a surface of the conductive material adjacent a respective air gap is covered by a discrete film of non-conducting material that does not extend over the conductive material nor beyond the air gap.

13. The semiconductor device of claim 12, wherein the non-conducting material is $SiO_2$ or $TiO_2$.

14. The semiconductor device of claim 12, wherein the film of non-conducting material controls corrosion of the surface of the conductive material covered by the film.

15. The semiconductor device of claim 12, wherein the film has a thickness of about 100 Å.

16. A semiconductor device comprising:
   a substrate having a planar extent;
   a patterned layer of conductive material disposed on the substrate and having a region thereof bordered by air gaps; and
   an overcoat layer overlying the patterned layer of conductive material and the air gap, the overcoat layer having a portion thereof overlying the conductive material in the region bordered by the air gaps, said portion extending below the height of the adjacent air gaps, and the air gaps having upper sides that are parallel to the planar extent of the substrate.

\* \* \* \* \*